US009148250B2

(12) United States Patent
Roberts et al.

(10) Patent No.: US 9,148,250 B2
(45) Date of Patent: Sep. 29, 2015

(54) METHODS AND ARRANGEMENTS FOR ERROR CORRECTION IN DECODING DATA FROM AN ELECTROMAGNETIC RADIATOR

(75) Inventors: Richard D. Roberts, Hillsboro, OR (US); Praveen Gopalakrishnan, Hillsboro, OR (US); Mathys C. Walma, Hillsboro, OR (US); Lei T. Yang, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/539,354

(22) Filed: Jun. 30, 2012

(65) Prior Publication Data

US 2014/0006907 A1    Jan. 2, 2014

(51) Int. Cl.
*H03M 13/00*    (2006.01)
*H04L 1/00*    (2006.01)
*H03M 13/09*    (2006.01)

(52) U.S. Cl.
CPC ............ *H04L 1/0045* (2013.01); *H03M 13/09* (2013.01)

(58) Field of Classification Search
CPC ........................... H04L 1/0057; H04L 1/0061
USPC .......... 714/776, 745, 725, 705, 704, 731, 48, 714/26
See application file for complete search history.

(56) References Cited

U.S. PATENT DOCUMENTS

| | | | |
|---|---|---|---|
| 4,422,099 A | | 12/1983 | Wolfe |
| 5,394,259 A | | 2/1995 | Takahara |
| 5,531,642 A | * | 7/1996 | Shiomi et al. .................. 464/74 |
| 5,577,733 A | * | 11/1996 | Downing ....................... 273/348 |
| 5,600,471 A | | 2/1997 | Hirohashi et al. |
| 5,903,373 A | | 5/1999 | Welch et al. |
| 5,970,208 A | * | 10/1999 | Shim .............................. 386/334 |
| 6,400,482 B1 | | 6/2002 | Lupton et al. |
| 6,570,694 B1 | | 5/2003 | Yegnanarayanan |

(Continued)

FOREIGN PATENT DOCUMENTS

| | | |
|---|---|---|
| EP | 1436952 B1 | 7/2004 |
| EP | 2106041 A1 | 9/2009 |

(Continued)

OTHER PUBLICATIONS

International Search Report and Written Opinion received for Patent Application No. PCT/US2011/060578, mailed on Mar. 15, 2012, 10 pages.

(Continued)

*Primary Examiner* — Fritz Alphonse
(74) *Attorney, Agent, or Firm* — Schubert Law Group PLLC (57) ABSTRACT

Embodiments may communicate via an electromagnetic radiator, or light source, that can be amplitude modulated such as light emitting diode lighting via receivers that can determine data from light received from the radiator. Some embodiments decode data of a packet transmitted from modulated lighting by means of a device with a low sampling frequency such as a relatively inexpensive camera. Many embodiments determine locations of start frame delimiters in packets. Several embodiments implement repeat decoding on packets of the same data to reduce packet error rates. Some embodiments are intended for indoor navigation via photogrammetry using self-identifying light anchors. In many embodiments, the data signal may be communicated via the light source at frequencies causing flicker that is not perceivable to the human eye.

30 Claims, 4 Drawing Sheets

(56) References Cited

U.S. PATENT DOCUMENTS

| | | | |
|---|---|---|---|
| 6,594,050 B2 | 7/2003 | Jannson et al. |
| 6,794,831 B2 | 9/2004 | Leeb et al. |
| 6,819,878 B1 | 11/2004 | King et al. |
| 6,941,076 B1 | 9/2005 | Adams et al. |
| 6,954,591 B2 | 10/2005 | Lupton et al. |
| 6,965,464 B2 | 11/2005 | Mossberg |
| 7,149,256 B2 | 12/2006 | Vrazel et al. |
| 7,415,212 B2 | 8/2008 | Matsushita et al. |
| 7,689,130 B2 | 3/2010 | Ashdown |
| 7,949,259 B2 | 5/2011 | Suzuki |
| 8,070,325 B2 | 12/2011 | Zampini et al. |
| 8,238,014 B2 | 8/2012 | Kucharski et al. |
| 8,260,137 B2 | 9/2012 | Linnartz |
| 8,334,901 B1 | 12/2012 | Ganick et al. |
| 8,417,124 B2 | 4/2013 | Ford |
| 8,488,971 B2 | 7/2013 | Linnartz et al. |
| 8,494,367 B2 | 7/2013 | Linnartz |
| 8,520,065 B2 | 8/2013 | Staats et al. |
| 8,579,437 B2 * | 11/2013 | Su et al. ............. 351/205 |
| 8,588,616 B2 | 11/2013 | Langer et al. |
| 8,588,621 B2 | 11/2013 | Dahan et al. |
| 8,620,165 B2 | 12/2013 | Kim et al. |
| 8,630,549 B2 | 1/2014 | Kim et al. |
| 8,665,508 B2 | 3/2014 | Kucharski et al. |
| 8,693,878 B2 | 4/2014 | Schenk et al. |
| 8,729,835 B2 | 5/2014 | Henig et al. |
| 8,737,842 B2 | 5/2014 | Schenk et al. |
| 8,818,204 B2 | 8/2014 | Roberts |
| 8,861,976 B2 | 10/2014 | Roberts |
| 2001/0055136 A1 | 12/2001 | Horiuchi et al. |
| 2002/0085094 A1 | 7/2002 | Teuchert |
| 2002/0089722 A1 | 7/2002 | Perkins et al. |
| 2002/0145776 A1 | 10/2002 | Chow et al. |
| 2002/0167701 A1 | 11/2002 | Hirata |
| 2003/0081287 A1 | 5/2003 | Jannson et al. |
| 2004/0120025 A1 | 6/2004 | LeHoty |
| 2004/0208616 A1 | 10/2004 | Melendez et al. |
| 2005/0002673 A1 | 1/2005 | Okano et al. |
| 2005/0036573 A1 | 2/2005 | Zhang et al. |
| 2005/0047392 A1 | 3/2005 | Smith |
| 2005/0135527 A1 | 6/2005 | Masui et al. |
| 2006/0204172 A1 | 9/2006 | Shahar |
| 2006/0239689 A1 | 10/2006 | Ashdown |
| 2006/0269287 A1 | 11/2006 | Bidmead et al. |
| 2007/0177161 A1 | 8/2007 | Ishii et al. |
| 2008/0049685 A1 | 2/2008 | Becker et al. |
| 2008/0205900 A1 | 8/2008 | Cole et al. |
| 2008/0298801 A1 | 12/2008 | King et al. |
| 2009/0196615 A1 | 8/2009 | Kauffman |
| 2009/0208221 A1 | 8/2009 | Sasai |
| 2009/0228755 A1 | 9/2009 | Franovici |
| 2009/0243815 A1 | 10/2009 | Tolli |
| 2010/0060972 A1 | 3/2010 | Kucharski et al. |
| 2010/0209119 A1 | 8/2010 | Lee et al. |
| 2010/0250125 A1 | 9/2010 | Lundberg et al. |
| 2010/0271476 A1 | 10/2010 | Damink et al. |
| 2010/0290516 A1 | 11/2010 | Lee et al. |
| 2010/0309958 A1 | 12/2010 | Lakkis |
| 2010/0316380 A1 | 12/2010 | de Lind Van Wijngaarden |
| 2011/0002695 A1 | 1/2011 | Choi et al. |
| 2011/0069971 A1 | 3/2011 | Kim et al. |
| 2011/0075581 A1 | 3/2011 | Mihota |
| 2011/0144941 A1 | 6/2011 | Roberts et al. |
| 2011/0164881 A1 | 7/2011 | Rajagopal et al. |
| 2011/0274429 A1 | 11/2011 | Caplan et al. |
| 2012/0008961 A1 | 1/2012 | Chen et al. |
| 2012/0033965 A1 | 2/2012 | Zhang et al. |
| 2012/0076498 A1 | 3/2012 | Sayeed et al. |
| 2012/0099868 A1 | 4/2012 | Fischer et al. |
| 2012/0109356 A1 | 5/2012 | Kong et al. |
| 2012/0162633 A1 | 6/2012 | Roberts et al. |
| 2012/0315036 A1 | 12/2012 | Kucharski et al. |
| 2013/0028609 A1 | 1/2013 | Staats et al. |
| 2013/0028612 A1 | 1/2013 | Ryan et al. |
| 2013/0126713 A1 | 5/2013 | Haas et al. |
| 2013/0170841 A1 | 7/2013 | Liu et al. |
| 2013/0247117 A1 | 9/2013 | Yamada et al. |
| 2013/0287403 A1 | 10/2013 | Roberts |
| 2013/0301569 A1 | 11/2013 | Wang et al. |
| 2014/0003817 A1 | 1/2014 | Roberts et al. |
| 2014/0003823 A1 | 1/2014 | Roberts et al. |
| 2014/0006907 A1 | 1/2014 | Roberts et al. |
| 2014/0064739 A1 | 3/2014 | Chen et al. |
| 2014/0086587 A1 | 3/2014 | Roberts et al. |
| 2014/0086590 A1 | 3/2014 | Ganick et al. |
| 2014/0093126 A1 | 4/2014 | Roberts |
| 2014/0093234 A1 | 4/2014 | Roberts et al. |
| 2014/0093238 A1 | 4/2014 | Roberts |
| 2014/0093249 A1 | 4/2014 | Roberts et al. |
| 2014/0153668 A1 | 6/2014 | Xi et al. |
| 2014/0219663 A1 | 8/2014 | Roberts |
| 2014/0308048 A1 | 10/2014 | Roberts et al. |

FOREIGN PATENT DOCUMENTS

| | | | |
|---|---|---|---|
| EP | 1436952 A1 | 11/2011 |
| JP | 2010-014408 A | 1/2010 |
| JP | 2010-283616 A | 12/2010 |
| JP | 5031427 B2 | 9/2012 |
| KR | 10-2006-0034883 A | 4/2006 |
| KR | 10-0761011 B1 | 9/2007 |
| KR | 10-2011-0083961 A | 7/2011 |
| KR | 10-1075747 B1 | 10/2011 |
| KR | 10-2012-0006306 A | 1/2012 |
| WO | 2008/113861 A2 | 9/2008 |
| WO | 2011/064342 A1 | 6/2011 |
| WO | 2012/037528 A2 | 3/2012 |
| WO | 2012/087944 A2 | 6/2012 |
| WO | 2013/048502 A1 | 4/2013 |
| WO | 2013/074065 A1 | 5/2013 |
| WO | 2013/101027 A1 | 7/2013 |
| WO | 2013/165751 A1 | 11/2013 |
| WO | 2014/046757 A1 | 3/2014 |
| WO | 2014/051754 A1 | 4/2014 |
| WO | 2014/051767 A1 | 4/2014 |
| WO | 2014/051768 A1 | 4/2014 |
| WO | 2014/051783 A1 | 4/2014 |

OTHER PUBLICATIONS

International Search Report and Written Opinion received for Patent Application No. PCT/US2011/054441, mailed on Apr. 23, 2012, 11 pages.

Roberts, et al., "Methods and Arrangements for Frequency Shift Communications by Undersampling", PCT Patent Application No. PCT/US2011/060578, filed on Nov. 14, 2011, 33 pages.

Roberts, Richard R., "Methods and Arrangements for Frequency Shift Communications", PCT Patent Application No. PCT/US2011/054441, filed on Sep. 30, 2011, 23 pages.

Roberts, et al., "Methods and Arrangements for Error Correction in Decoding Data From an Electromagnetic Radiator", U.S. Appl. No. 13/539,354, filed on Jun. 30, 2012, 45 pages.

Roberts, et al., "Methods and Arrangements for Generating a Waveform for Frequency Shift Keying Communications", U.S. Appl. No. 13/539,351, filed on Jun. 30, 2012, 47 pages.

Daisuke, et al., "A Hybrid and Linear Registration Method Utilizing Inclination Constraint", ISMAR '05 Proceedings of the 4th IEEE/ACM International Symposium on Mixed and Augmented Reality, pp. 140-149.

Yoshino, et al., "High-accuracy Positioning System using Visible LED Lights and Image Sensor", 1-4244-1463-6/08 RWS 2008 IEEE, pp. 439-442.

Wikipedia, "Rotation matrix", From Wikipedia, the free encyclopedia; Available at: http://en.wikipedia.org/wiki/Rotation_matrix, pp. 1-22.

Roberts, et al., "Methods and Apparatus for Multiphase Sampling of Modulated Light", U.S. Appl. No. 13/630,066, filed on Sep. 28, 2012, 71 pages.

Roberts, Richard R., "Location Detection System", PCT Patent Application No. PCT/US2011/62578, filed on Nov. 30, 2011, 51 Pages.

(56) References Cited

OTHER PUBLICATIONS

Gopalakrishnan, et al., "Location Based Technology for Smart Shopping Services", PCT Patent Application No. PCT/US2011/067749, filed on Dec. 29, 2011, 18 Pages.
Notice of Allowance received for U.S. Appl. No. 13/625,361, mailed on Dec. 17, 2014, 10 pages.
Office Action received for U.S. Appl. No. 13/629,843, mailed on Nov. 7, 2014, 19 pages.
International Preliminary Report on Patentability and Written Opinion received for PCT Patent Application No. PCT/U52013/037787, mailed on Nov. 4, 2014, 8 pages.
Daisuke, et al., "A Hybrid and Linear Registration Method Utilizing Inclination Constraint", ISMAR '05 Proceedings of the 4th IEEE/ACM International Symposium on Mixed and Augmented Reality, 2005, pp. 140-149.
Horikawa, et al., "Pervasive Visible Light Positioning System using White LED Lighting", vol. 103; No. 721(CS2003 178-197), 2004, pp. 93-99.
International Search Report and Written Opinion received for PCT Patent Application No. PCT/US2011/054441, mailed on Apr. 23, 2012, 11 pages.
International Search Report and Written Opinion received for PCT Patent Application No. PCT/US2011/060578, mailed on Mar. 15, 2012, 10 pages.
International Search Report and Written Opinion received for PCT Patent Application No. PCT/US2013/037787, mailed on Aug. 12, 2013, 9 pages.
International search Report and Written Opinion received for PCT Patent Application No. PCT/US2013/047347, mailed on Aug. 27, 2013, 13 pages.
Tanaka, et al., "New Position Detection Method using Image Sensor and Visible Light LEDs", IEEE Second International Conference on Machine Vision, Dec. 28-30, 2009, pp. 150-153.
Wikipedia, "Rotation matrix", From Wikipedia, the free encyclopedia, retrieved on Nov. 1, 2012, pp. 1-22. Available at: http://en.wikipedia.org/wiki/Rotation_matrix.
Yoshino, et al., "High-accuracy Positioning System using Visible LED Lights and Image Sensor", IEEE, 2008, pp. 439-442.
International Search Report and Written Opinion received for PCT Patent Application No. PCT/US2013/047343, mailed on Oct. 7, 2013, 11 pages.
International Search Report and Written opinion for PCT Patent Application No. PCT/US2013/047350, mailed on Sep. 25, 2013, 11 pages.
International Search Report and Written Opinion received for PCT Patent Application No. PCT/US2013/047772, mailed on Sep. 27, 2013, 10 pages.
Notice of Allowance received for U.S. Appl. No. 13/460,224, mailed on Apr. 16, 2014, 13 pages.
Notice of Allowance received for U.S. Appl. No. 13/539,354, mailed on Apr. 1, 2014, 5 pages.
Notice of Allowance received for U.S. Appl. No. 13/538,888, mailed on Jun. 17, 2014, 11 pages.
International Preliminary Report on Patentability and Written opinion received for PCT Patent Application No. PCT/US2011/054441, mailed on Apr. 10, 2014, 14 pages.
International Preliminary Report on Patentability and Written Opinion received for PCT Patent Application No. PCT/US2011/060578, mailed on May 30, 2014, 10 pages.
International Search Report received for PCT Patent Application No. PCT/US2013/046224, mailed on Sep. 16, 2013, 3 pages.
Office Action received for U.S. Appl. No. 13/460,224, mailed on Oct. 11, 2013, 12 pages.
Notice of Allowance received for U.S. App. No. 13/539,354, mailed on Aug. 29, 2014, 7 pages.
Office Action received for U.S. Appl. No. 13/539,354, mailed on Nov. 21, 2013, 6 pages.
Office Action received for U.S. Appl. No. 13/625,361, mailed on Jul. 31, 2014, 11 pages.
International Preliminary Report on Patentability and Written Opinion received for PCT Patent Application No. PCT/US2013/047343, mailed on Oct. 7, 2013, 11 pages.

* cited by examiner

METHODS AND ARRANGEMENTS FOR ERROR CORRECTION IN DECODING DATA FROM AN ELECTROMAGNETIC RADIATOR

BACKGROUND

The present disclosure relates generally to communication technologies. More particularly, the present disclosure relates to transmitting and receiving and interpreting data transmissions via modulated electromagnetic radiation such as light.

DETAILED DESCRIPTION OF EMBODIMENTS

The following is a detailed description of novel embodiments depicted in the accompanying drawings. However, the amount of detail offered is not intended to limit anticipated variations of the described embodiments; on the contrary, the claims and detailed description are to cover all modifications, equivalents, and alternatives falling within the spirit and scope of the present teachings as defined by the appended claims. The detailed descriptions below are designed to make such embodiments understandable to a person having ordinary skill in the art.

References to "one embodiment," "an embodiment," "example embodiment," "various embodiments," etc., indicate that the embodiment(s) so described may include a particular feature, structure, or characteristic, but not every embodiment necessarily includes the particular feature, structure, or characteristic. Further, repeated use of the phrase "in one embodiment" does not necessarily refer to the same embodiment, although it may.

As used herein, unless otherwise specified the use of the ordinal adjectives "first," "second," "third," etc., to describe a common object, merely indicate that different instances of like objects are being referred to, and are not intended to imply that the objects so described must be in a given sequence, either temporally, spatially, in ranking, or in any other manner.

Embodiments relate to communicating data by varying a frequency of an amplitude modulated electromagnetic radiator, or light source. Embodiments may comprise logic such as hardware and/or code to transmit and to determine data from the amplitude modulated light sources. Many embodiments may provide a method of receiving/decoding data from the modulated LED lighting by means of a device with a low sampling frequency such as a relatively inexpensive camera (as might be found in a smart phone). Such embodiments overcome some issues related to the sampling rate of the camera being very low (typically 100 frames per second or less) and avoidance of modulation of LED lighting that may cause noticeable or perceivable flicker to the human eye.

Several embodiments determine locations of start frame delimiters in packets and select the location of the true start frame delimiter from locations including falsely identified locations of the start frame delimiter. Several embodiments implement repeat decoding on packets of the same data to reduce packet error rates. Some embodiments are intended for indoor navigation via photogrammetry (i.e., image processing) using self-identifying LED light anchors and can be useful for markets involving, e.g., indoor navigation capabilities like "smart shopping".

Some embodiments may encode bits of data via frequency shift keying of a repetitive ON/OFF keying waveform and applying the waveform or signal to a driver of the light source to adjust the frequency of modulation of the light source based upon the changes in the frequency of the waveform. The frequency range of the ON/OFF keying can be high enough to prevent flicker (e.g., greater than 100 Hz) but when sampled (more precisely subsampled at a rate below the Nyquist rate) by, e.g., a smart phone camera, the data modulation aliases to frequency components that can be image processed (over the duration of a short video or a series of images) to decode the modulation information.

Various embodiments may be designed to address different technical problems associated with communications via an electromagnetic radiator, or light source. For instance, some embodiments may be designed to address one or more technical problems such as integration times or exposure times associated with photo detectors of a camera that receives frequency modulated light. The technical problem of integration times or exposure times may involve integration of energy received from the light source, obfuscating on and off states of light from the light source. Other technical problems may involve frequency slippage of the camera's sampling frequency with respect to the frequency modulation of the light source, bit decision errors related to integration times and frequency slippage, burst errors due to sampling during bit transitions, decoding bits related to samples of the light emanated from a light source, packet error rates associated with decoding data from a frequency modulated light source, and detection of a start frame delimiter, amongst other technical problems.

Further embodiments may be designed to address one or more other technical problems such as integration times or exposure times may involve integration of energy received from the light source. In several embodiments, addressing the technical problem of integration times or exposure times may involve integration of energy received from the light source may involve decoding repeated transmissions of the same data and making bit decisions based upon the prevalent bits determined for the data of the packet.

Other embodiments may address technical problems such as burst errors due to sampling during bit transitions by determining a variance associated with the bits or the packet, comparing the variance with variances of other packets, and eliminating the packet with the least variance.

Technical problems such as one or more of the technical problems discussed above have not been known in the art until discovery and teaching represented by this disclosure. A lack of understanding of technical problems led to the failure of current art to conceive of, discuss, and describe the solutions such as the solutions described by this disclosure. In other words, the solutions presented herein were not obvious in the art due at least in part to a lack of knowledge of the technical problems by other persons of skill in the art.

Different technical problems such as those discussed above may be addressed by one or more different embodiments. For instance, some embodiments that are designed to address decoding bits related to samples of the light emanated from a light source may do so by one or more different technical means such as contiguous capture of video frames for multiple packets from the same light source. Furthermore, some of these embodiments may implement frequency domain transformations and other embodiments may implement time domain calculations of bins indicative of the magnitudes of the light at different frequencies. Further embodiments that are designed to address the technical problem of to address decoding bits related to samples of the light emanated from a light source may do so by one or more different technical means such as noncontiguous capture of video frames for multiple packets from the same light source.

Logic, modules, devices, and interfaces herein described may perform functions that may be implemented in hardware and/or code. Hardware and/or code may comprise software, firmware, microcode, processors, state machines, chipsets, or combinations thereof designed to accomplish the functionality.

Embodiments may facilitate wireless communications. Wireless embodiments may integrate low power wireless communications like Bluetooth®, wireless local area networks (WLANs), wireless metropolitan area networks (WMANs), wireless personal area networks (WPAN), cellular networks, and/or Institute of Electrical and Electronic Engineers (IEEE) standard 802.15.4, "Wireless Medium Access Control (MAC) and Physical Layer (PHY) Specifications for Low Rate Wireless Personal Area Networks (LR-WPANs)" (2006) (http://standards.ieee.org/getieee802/download/802.15.4-2006.pdf), communications in networks, messaging systems, and smart-devices to facilitate interaction between such devices. Furthermore, some wireless embodiments may incorporate a single antenna while other embodiments may employ multiple antennas. For instance, multiple-input and multiple-output (MIMO) is the use of multiple antennas at both the transmitter and receiver to improve communication performance.

While some of the specific embodiments described below will reference the embodiments with specific configurations, those of skill in the art will realize that embodiments of the present disclosure may advantageously be implemented with other configurations with similar issues or problems.

Figure 1:
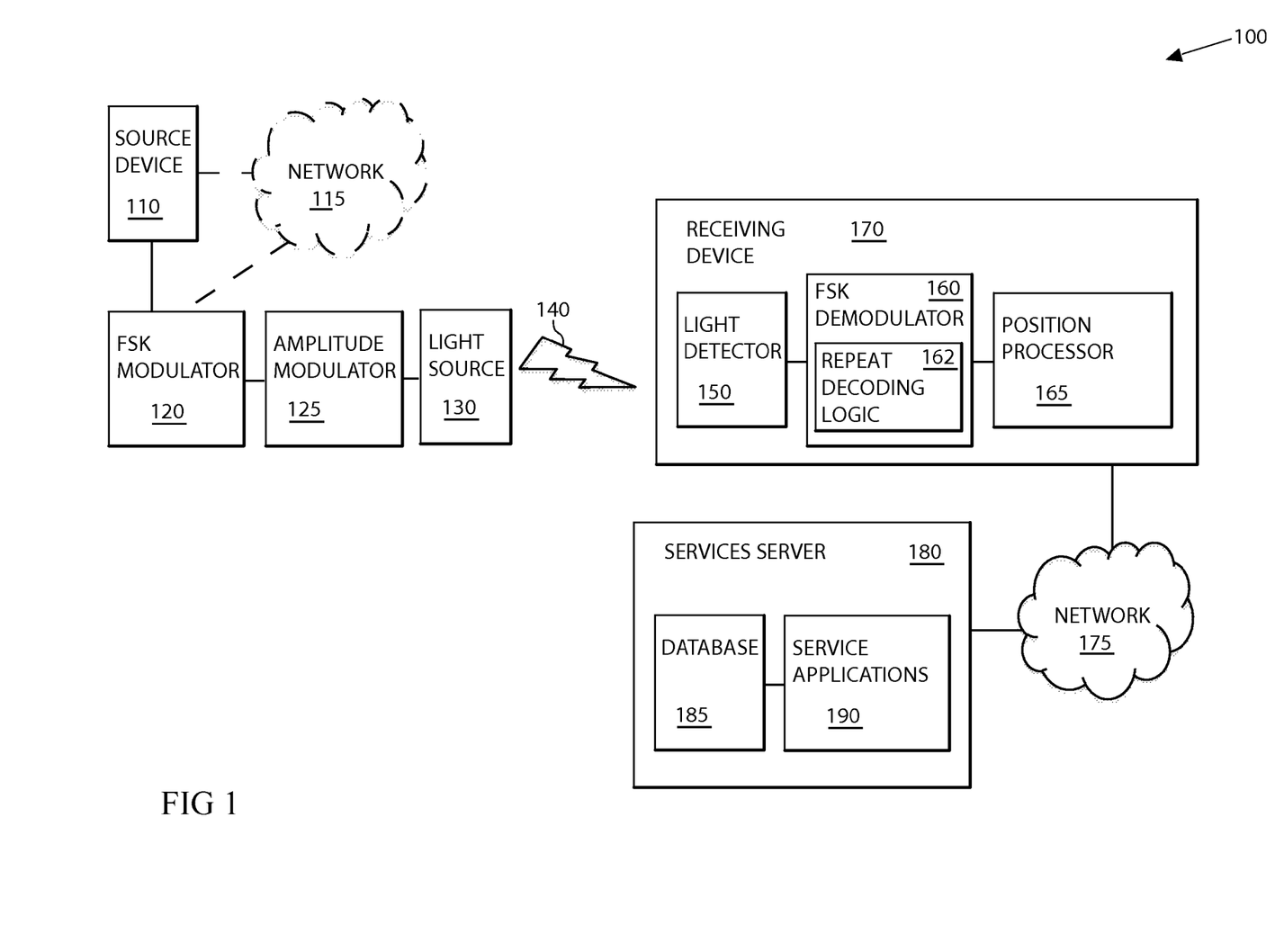
FIG. 1 depicts an embodiment of a system including devices to transmit and to receive data communicated by varying a modulation frequency of an amplitude-modulated light source.

Turning now to FIG. 1, there is shown an embodiment of a system 100 system including devices to transmit and to receive data communicated by varying a modulation frequency of an amplitude-modulated light source. System 100 comprises a source device 110, a network 115, a frequency shift keying (FSK) modulator 120, an amplitude modulator 125, a light source 130 to transmit light 140, a light detector 150, an FSK demodulator 160, and a receiving device 170. System 100 also includes a network 175 communicatively coupling the receiving device 170 and a services server 180 to facilitate services such as "smart shopping". System 100 may communicate data originating from the source device 110 to the receiving device 170 wirelessly via the light source 130. For example, the light source 130 may be a visible light source to provide light for areas within a shopping mall. The light source 130 may provide an identification number, or unique number, as a bit sequence that may facilitate a determination of the location of the receiving device 170 within the shopping mall. In many embodiments, the receiving device 170 may simultaneously receive modulated light from multiple light sources such as the light source 130 to facilitate determining the location of the receiving device 170 by, e.g., triangulation.

The source device 110 may couple with the FSK modulator 120 to provide data to the FSK modulator 120 to transmit via the light source 130. The source device 110 may transmit a data signal to the FSK modulator 120 so the data may be transmitted to the receiving device 170. In some embodiments, the source device 110 may comprise a processor-based device such as a desktop computer, a notebook, a laptop, a Netbook, a smartphone, a server, or the like that is capable of transmitting a data signal to the FSK modulator 120. In further embodiments, the source device 110 may be integrated with the FSK modulator 120 or both the source device 110 and the FSK modulator 120 may comprise parts of another device.

In many embodiments, the source device 110 may digitally modulate or otherwise transmit the data to the FSK modulator 120. The data may comprise one or more repetitions of the bit sequence to be communicated from the light source 130 to the receiving device 170. The FSK modulator 120 may store the data in memory within or coupled with the FSK modulator 120 such as read only memory (ROM). In some embodiments, the source device 110 may comprise a bit shift circulating register to shift bits comprising an identification number (a bit sequence) that is unique for the light source 130 through a series of registers in order and to the FSK modulator 120. In some embodiments, however, the uniqueness of the identification number may be relative to nearby light sources. In many of these embodiments, the order and content of the bits of the data may establish the timing of frequency changes to the amplitude modulation of light emitted from the light source 130.

In an alternative embodiment, as indicated by the dashed lines, the source device 110 may comprise a local network interface to communicatively couple the source device 110 with the FSK modulator 120 via the network 115. For instance, the network 115 may comprise a physical and/or wireless network such as a corporate intranet, wireless local area network (WLAN), a local area network (LAN), or other network capable of communicating data between devices. In some embodiments, the network 115 may comprise a distinct network from the network 175 in a physical or logical sense to, e.g., separate business operations from public operations. In some of these embodiments, both networks 115 and 175 may couple with a larger network such a metropolitan area network or the Internet.

The FSK modulator 120 may receive the data signal from the source device 110 and couple with the amplitude modulator 125 to modulate the light 140 emitted by the light source 130 in a pattern that facilitates communication of data from the data signal. The FSK modulator 120 may communicate by modulating logical ones and zeros at different frequencies. For example, after the FSK modulator 120 receives the data from the source device 110 and stores the data received as a bit sequence in memory such as ROM, the FSK modulator 120 may repeatedly transmit the bit sequence via a digital-to-analog converter (DAC) to drive the amplitude modulator 125.

The FSK modulator 120 may generate an output signal at a first frequency to communicate a logical zero and generate the output signal at a second frequency to communicate a logical one. The amplitude modulator 125 may modulate the amplitude of the light 140 at the frequencies established by the output signal of the FSK modulator 120 and drive the light source to communicate the data via the light 140 emitted from the light source 130.

The FSK modulator 120 may transmit the same data repeatedly to facilitate receipt of the data by the receiving device 170 as well as reduced packet error rates via repeat decoding processes. For instance, the FSK modulator 120 may transmit the data to the receiving device 170 multiple times and consecutively to allow the receiving device 170 to sample the amplitude-modulated light multiple times for each bit at a sampling frequency that is lower than or equal to the first frequency or the second frequency.

In many embodiments, the FSK modulator 120 may generate output signals at specific tones such as one times (1×) the sampling frequency, one point two-five times (1.25×) the sampling frequency, one point five times (1.5×) the sampling frequency, one point seven-five times (1.75×) the sampling frequency, two times (2×) the sampling frequency, two point two-five times (2.25×) the sampling frequency, and the like. In several embodiments, the first frequency may be a harmonic frequency or overtone frequency of the sampling frequency and the second frequency may be halfway between the harmonic or overtone frequencies. For example, the first frequency may be 1× the sampling frequency and the second frequency may be 1.5× the sampling frequency. In another embodiment, the first frequency may be 1.5× the sampling frequency and the second frequency may be 2× the sampling frequency.

In many embodiments, the FSK modulator 120 may generate an output signal at a delimiter frequency prior to each repetition of the transmission of the data to delimit or demark the start of a data transmission and/or the end of a data transmission. For example, the FSK modulator 120 may generate the output signal at a delimiter frequency that is between the first frequency and the second frequency. In many embodiments, the delimiter frequency may be halfway between the first frequency and the second frequency such as 1.25× the sampling frequency, 1.75× the sampling frequency, 2.25× the sampling frequency, or the like.

For embodiments that utilize a visible light source 130, the light 140 may be modulated at a frequency that is not visible to the human eye such as a frequency above 60 Hertz (Hz) or, in many embodiments, above 100 Hz. For instance, if the sampling frequency of the receiving device 170 is 60 Hz then the FSK modulator 120 may modulate the first frequency at 60 Hz, the delimiter frequency at 75 Hz, and the second frequency at 90 Hz. In other embodiments, the FSK modulator 120 may modulate the first frequency at a minimum of 120 Hz, the delimiter frequency at a minimum of 135 Hz, and the second frequency at a minimum of 150 Hz.

The FSK modulator 120 may modulate the light 140 emitted from the light source 130 via the amplitude modulator 125 by switching the power to the light source 130 to turn the light 140 on and turn the light 140 off at the frequency of the output signal. The light source 130 may comprise an electromagnetic radiator that can be amplitude modulated such as a light emitting diode. The amount of data that may be communicated via, e.g., a visible light source without producing flicker perceivable by a human eye can vary based upon the speed with which the light source 130 can be amplitude modulated as well as the speed with which the receiving device 170 can capture and process samples from the light 140. In some embodiments, the light source 130 may comprise a visible light source. In some embodiments, the light source 130 may comprise an infrared light source. And, in some embodiments, the light source 130 may comprise an ultraviolet light source.

The light source 130 illustrated in FIG. 1 may be one light source of many light sources. For instance, the light source 130 may be a light source in one light fixture of many light fixtures in a shopping mall. In some embodiments, more than one of the light fixtures may comprise light sources transmitting the same data. For example, a department store may have hundreds of light fixtures. Each light fixture or every other light fixture may comprise a light source like 130 that can be amplitude modulated and each of those light sources may transmit a unique identification number. The receiving device 170 may be a smart phone of a user or shopper looking for a particular item within the department store and the user may wish to find a particular item in the store. In the department store, the light sources may repeatedly transmit their respective identification numbers, such as 10 bit identification codes. Upon entering the department store, the receiving device 170 may begin to receive the transmissions of the identification numbers from the light sources. The receiving device 170 may process the signals to determine the frequency modulations and associate the frequency modulations with the identification numbers for a number of the light sources. The receiving device 170 may transmit the identification numbers to the services server 180 via the network 175 and, in response, the receiving device 170 may receive an indication of the location, such as a three dimensional location, of the receiving device 170 and/or the location of the particular item within the department store with respect to the location of the receiving device 170 and the user.

The light source 130 emits modulated light 140 with the data from the data signal at a location at which the light detector 150 can receive the light 140. In many embodiments, the user may be walking through the store or mall while the user's smart phone or tablet is receiving packets from light sources such as light source 130. However, the user's smart phone must be in a position that allows the camera of the smart phone to capture light emanated from the light source 130 at least long enough for the smart phone to capture frames representative of a complete packet of data.

The receiving device 170 may comprise a hardware device to interact with a user of the receiving device 170. In many embodiments, the receiving device 170 may be a portable device such as a portable data assistant, a smart phone, a camera, a laptop, a notebook, a netbook, an iPad, an iPhone, or the like. The receiving device 170 comprises a light detector 150 and an FSK demodulator 160 to receive and interpret the frequency-modulated light from the light source 130 and other such light sources by undersampling the modulated light emitted by the light sources such as light source 130. In many embodiments, the receiving device 170 also comprises a position processor 165 to determine the position of the receiving device 170 based upon the identification numbers of the light sources identified by the FSK demodulator 160.

The light detector 150 may convert the light 140 into an electrical signal, such as a pixel of an image representative of the light 140 or a current of a photo diode. For example, the light detector 150 may comprise a camera or an array of photo detectors. The light detector 150 may capture an image of light sources including light source 130 and may comprise storage logic (not shown) to store the image to a storage medium such as dynamic random access memory (DRAM), a flash memory module, a hard disk drive, a solid-state drive such as a flash drive or the like.

The light detector 150 may also comprise sample logic to determine samples of the waveform of the amplitude-modulated light from images captured by the light detector 150. For instance, the sample logic may identify pixels from the image associated with light sources to identify the light sources and may determine the state of the identified light sources, i.e., whether the image indicates that a light source is emitting light (the light source is on) or the light source is not emitting light (the light source is off). In some embodiments, the sample logic may receive a value for a light source from the photo detector such as a voltage or a current that is indicative of the energy captured from the light source 130 within the particular frame that is captured by the light detector 150. The sample logic may then determine a chip based upon a determined state of the light source 130 in the particular frame such as a chip having a value of one (1) when the light source 130 is in the on state and a chip having a value of negative one (−1) when the light source 130 is in the off state. In many embodiments, the sample logic may also determine a variance associated with the value in the frame or in multiple frames indicative of a range of the energy received by the photo detector from the light source 130 in the frame or frames. Repeat decoding logic 162 may utilize the variance or variances associated with a packet of data received from the light source 130 to facilitate bit decisions. In other embodiments, the sampling logic may comprise part of the FSK demodulator 160 or otherwise be independent of and coupled with the light detector 150.

The light detector 150 may capture images at a sampling frequency (Fs). The sampling frequency may be a limitation of the receiving device 170 in some embodiments and may be a setting of the receiving device 170 in other embodiments. In further embodiments, another signal or user notification may indicate the sampling frequency for which the FSK modulator 120 is configured and the receiving device 170 may adjust the sampling frequency of the light detector 150 to match that sampling frequency either automatically or with some interaction with the user.

The light detector 150 may sample or capture samples indicative of the frequency of the amplitude-modulated light 140 at the sampling frequency, undersampling the signal transmitted via the light 140. This process of undersampling effectively aliases the frequency of the signal transmitted via the light 140 to a lower frequency. For embodiments in which the first frequency is an integer multiple (N*Fs) of the sampling frequency and the second frequency is an integer plus one half multiple (N+½)*Fs, which is a harmonic or overtone of the sampling frequency, the sample logic captures samples of the first frequency that appear to be at a frequency that is at zero Hz and samples of the second frequency that appear to be at a frequency that is half of the sampling frequency.

The FSK demodulator 160 couples with the light detector 150 to receive the chips and variances, to determine the bit or bits represented by the light, to improve the accuracy or reduce the packet error rate associated with decoding the packet from the light source 130 via repeat decoding, and to output the bits to, e.g., the services server 180. As a result of the undersampling, the first frequency may appear to the FSK demodulator 160 to be approximately a waveform at zero Hz with an assigned value that is either the minimum value, e.g., −1, or the maximum value, e.g., 1, throughout the waveform. The second frequency may appear to the FSK demodulator 160 to be approximately a signal with the frequency of the sampling frequency divided by two, alternating between a high and a low value. And the delimiter frequency, which may be approximately halfway between the first frequency and the second frequency, may appear to be at half the frequency of the second frequency, switching between the minimum value and the maximum value at half the speed of the second frequency and including two lows and two highs. For instance, depending upon the time at which the sampling begins, the delimiter frequency may provide one of four patterns of samples including: (1) Low-Low-High-High, (2) High-High-Low-Low, (3) Low-High-High-Low, and (4) High-Low-Low-High.

In many embodiments, this delimiter may be preceded by two frames of light emission in which the light is "half on" (appears half bright). Embodiments may accomplish the transmission of these "half on" frames in several ways. For example, one feasible method is to transmit a very rapid on and off sequence for two frames, at such a pulsing rate that the receiving device 170 cannot follow the individual light levels at the sampling frequency of the light detector 150 and only senses the average value.

The FSK demodulator 160 may process the samples to determine frequency components of the waveform transmitted by the light source 130. In some embodiments, the frequency components may be determined by performing a Fourier transform on the samples received from the light detector 150. For example, the FSK demodulator 160 may perform a fast Fourier transform (FFT) to determine the amplitudes of the waveforms at various frequencies and may make bit decisions incoherently using only the FFT amplitudes to associate the frequency modulations of the light with bits of data. The number of points in the FFT is dependent upon the data rate. In one embodiment, the FSK demodulator 160 may perform a four point FFT. The four point FFT is used when operating at the highest data rate for sampling, which is BIT_RATE=Fs/2. For embodiments in which the highest bit rate may not be used, such as BIT_RATE=Fs/10, the number of points in the FFT would be more than four. Other embodiments may use a discrete Fourier transform (DFT) in lieu of the FFT.

The FSK demodulator 160 may begin by processing the chips received from the sampling logic of the light detector 150 to determine a location of a start frame delimiter, or the delimiter frequency, for the packet received from or being received from the light source 130. As a result of the repeated transmissions of the packet of data from the light source 130, packets may comprise a constant number of chips and the chips representative of the delimiter frequency will reside a some location within each packet that depends upon the portion of the packet being transmitted at the time that the light detector 150 begins to capture frames comprising samples of the light source 130. For example, if a packet comprises 24 frames and the start frame delimiter is present in four of the 24 frames, the FSK demodulator 160 may begin by processing successive groups of four consecutive chips until a pattern of chips is found that is indicative of the start frame delimiter.

The packet of 24 chips can be treated as or considered a circular buffer since the transmission of the packet repeats and the starting position of the reception of the packet is random. The last chip in a packet of 24 chips, which is just prior to the start frame delimiter, will either be a high or a low and if the start frame delimiter is HLLH, the low will be transitioning to high just prior to the transmission of the start frame delimiter.

Then, if multiple packets are captured in contiguous video frames, modulo math may be implemented to locate the subsequent locations of the start frame delimiter. For example, if the start frame delimiter is found to start at chip five and the number of chips per packet is 24, then the next start frame delimiter will start at chip 29 (i.e., 24 plus five; the number of chips per packet plus the starting location of the start frame delimiter) and the next start frame delimiter will start at chip 53 (i.e. 24 plus 24 plus five), and so on.

Once the FSK demodulator 160 determines the location of the start frame delimiter in each of the one or more packets, the FSK demodulator 160 may decode the bits of the packet by reviewing the chip values starting with the chip immediately following the start frame delimiter. For instance, the packet with 24 chips may comprise two chips per bit so the FSK demodulator 160 may determine the bits of the packet by associating the frequency components identified with a logical zero or a logical one. By determining the bits of the packet, the FSK demodulator 160 may determine the identification number associated with the light source 130.

In some embodiments, the FSK demodulator 160 may determine a bit from the chips associated with bit by calculating the frequency components associated with the two chips. In one embodiment, the FSK demodulator 160 may perform a 4-point fast Fourier transform, or the equivalent time domain calculations, to determine the bit. The two chips may comprise the first two points and the remaining two points may be set to logical zeroes or otherwise filled with neutral values. The resulting magnitudes of the frequency components can then be evaluated to determine the bit associated with the chips. In other embodiments, the FSK demodulator 160 may utilize different Fourier transform calculations using the frequency domain and time domain processes or just time domain processes. In further embodiments, the FSK demodulator 160 may implement other methods of identifying the frequency components of the chips or may determine bits from the chips without determining the frequency components.

Many embodiments of the FSK demodulator 160 further comprise repeat decoding logic 162. The repeat decoding logic 162 may compare the bits determined for multiple packets from the light source 130 and reduce the packet error rate by selecting the prevalent bit determinations. In some embodiments, for instance, if an odd number of packets are determined, the repeat decoding logic 162 may determine each bit of the packet by bit voting. Bit voting may involve determining, at each bit position, whether more packet determinations include a logical one or include a logical zero and selecting the prevalent determination.

In many embodiments, if an even number of packets are determined, the repeat decoding logic 162 may eliminate the packet that is least like the other packets and then determine each bit of the packet by bit voting. In some embodiments, determining that packet that is least like the other packets may involve determining a variance associated with the packet and/or variances associated with each of the bits of the packets. Variances associated with bits may be determined in some embodiments by the sample logic of the light detector 150 by determining the differences between the values from frames associated with each of the chips and the mean or average values from the frames. For instance, the FSK demodulator 160 may discard the packets that are associated with the least variance between the values and the average or mean values because the values may represent either burst errors resulting from frequency slippage or chip decisions based upon bit transitions' that are more prone to error than chip decisions that have a greater variance from the average or mean value.

In other embodiments, the FSK demodulator 160 may eliminate bits utilized for bit voting from the bit voting based upon variances associated with the individual bits rather than variances associated with the packets. In further embodiments, other factors may be used to determine bit decisions. In still other embodiments, weights may be assigned to bits based upon variances associated with the bits or the packets and the repeat decoding logic 162 may determine bits of a packet of data based upon weights associated with each of the bit decisions.

The receiving device 170 may also comprise a position processor 165. The position processor 165 may determine the position of the receiving device 165 based upon the identification numbers determined by the FSK demodulator 160. For example, the light source 130 may comprise one of many light sources in a warehouse. The light sources may transmit their respective identification numbers and the position processor 165 may receive the identification numbers from the receiving device 170. The particular identification numbers identified by the receiving device 170 and, in some embodiments, the timing of receipt of the identification numbers, may provide information to the position processor 165 to identify the location of the receiving device 170 and, in some embodiments, the direction of movement of the receiving device 170. In particular, the position processor 165 may interact with the services server 180 to obtain data about the light sources associated with the identification numbers from the database 185.

In some embodiments, the position processor 165 may compare the identification numbers received from the FSK demodulator 160 against identification numbers stored in the database 185, associate the identification numbers with the locations of the light sources such as light source 130 and determine the specific location of the receiving device 170 based upon the locations of the light sources identified by the identification numbers via database 185. The receiving device 160 may communicate with the services server 180 to obtain services such as directing the user of the receiving device 170 to a particular object in the warehouse, a particular location of interest in the warehouse, showing a map of the warehouse with the user's current location, showing the location of another receiving device in the warehouse, or other service that relates to the users location or the location of a receiving device.

The receiving device 170 may obtain the services by, e.g., downloading one or more service applications 190, downloading maps, requesting location information for particular items or other locations of interest, downloading part or all of the database 185, or the like. In one embodiment, the location information for the light sources such as the x,y,z coordinates of the light source 130 may be downloaded or at least begin to be downloaded by the receiving device 170 upon entering a facility offering such services. In some embodiments, the receiving device 170 may provide the location of the receiving device 170 to the services server 180 to obtain services. In alternative embodiment, the receiving device 170 may provide the identification numbers for the light sources such as light source 130 to the services server 180 to obtain the location of the receiving device 170 and/or services for the user of the receiving device 170.

The database 185 may comprise identification numbers and associated location information such as the x,y,z coordinates of the light sources. Based upon this information, the location processor 165 may calculate the location of the receiving device 170. In other embodiments, the results of calculations for locations of the receiving device 170 in the warehouse may be stored in the receiving device 170 for future reference. In several embodiments, the potential locations of the receiving device 170 may be predetermined so that the database 185 contains location information for the receiving device 170 associated with groups of identification numbers. The location processor 165 may look up the location of the receiving device 170 based upon the identification numbers provided by the FSK demodulator 160. In still other embodiments, the locations of the receiving device may be partially calculated and stored in the database 185 and, in some of these embodiments, the partial calculations may be downloaded to the receiving device 170.

Figure 2:
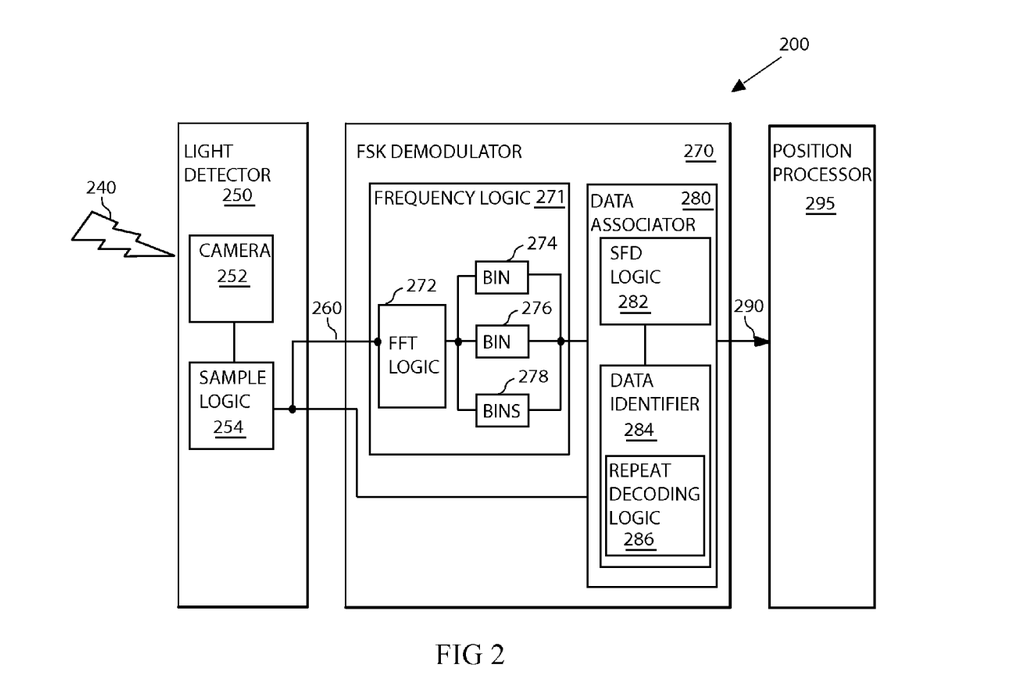
FIG. 2 depicts an embodiment of an apparatus to receive data communicated by varying a modulation frequency of amplitude-modulation of a light source.

FIG. 2 depicts an embodiment of an apparatus 200 to receive data communicated by varying a modulation frequency of amplitude modulation of a light source. For instance, lighting in a department store may communicate data to smart devices such as smart phones of customers to provide information about special sales or to offer coupons for products.

Apparatus 200 may comprise a light detector 250 and an FSK demodulator 270. In many embodiments, the light 240 may precede the start frame delimiter with two or more frames light 240 that is modulated at a high frequency such that the light detector 250 perceives a half bright or half intensity light 240. Thereafter, the light 240 may comprise light that is modulated between two or more states such as an "off" state and an "on" state at different frequencies indicative of different bits or of a start frame delimiter. The frequencies may be related in that a first frequency may be an integer multiple of the sampling frequency, N*Fs, wherein N is an integer (1, 2, 3, 4, 5, 6, . . . ) and Fs is the sampling frequency of the light detector 250. A second frequency may be (N+½)*Fs, and a start frame delimiter frequency may be (N+¼)*Fs. Alternatively, the second frequency may be (N−½)*Fs, and the start frame delimiter frequency may be (N−¼)*Fs. In other embodiments, the first frequency may be an integer multiple of the sampling frequency, (N+1)*Fs, the second frequency may be (N+½)*Fs or (N−½)*Fs, and the start frame delimiter frequency may be (N+¾)*Fs or (N−¾)*Fs. Some embodiments may associate a logical 1 with the first frequency and the logical 0 with the second frequency and these logical bit associations can be reversed in other embodiments.

In several embodiments, the light comprises visible light. In other embodiments, light source may generate infrared light, ultraviolet light, or visible light. In further embodiments, the light source may switch between two different "on" states such as a full-power state in which the full-rated current or voltage for the light source is applied to the light source and a half-power state in which half the rated current or voltage is applied to the light source to generate the light 240. In still further embodiments, the light source may comprise multiple sources such as multiple LEDs and less than all of the light sources may be turned off to create a "partially on" state for modulation.

A receiving device may receive the light 240, such as the receiving device 170 in FIG. 1, via a light detector 250 and an FSK demodulator 270. The light detector 250 may receive the light 240 and generate an electrical signal 260 based upon the light 240 at a frequency of the amplitude modulation of the light 240. For instance, when the light 240 is modulated at 100 Hz, the light detector 250 may generate an electrical signal 260 with energy primarily transmitted at 100 Hz.

The light detector 250 may comprise a camera 252 and sample logic 254. The camera 252 may be capable of capturing frames of video at a sampling rate of, e.g., 100 Hz and the FSK modulator 210 may be tuned for a sampling frequency (Fs) of, e.g., 100 Hz. The camera 252 may capture multiple frames of video and each frame of video may be analyzed by the sample logic 254 to determine the number of light sources 230 associated with each frame, to associate the light sources of a first frame with the same light sources in a subsequent frame, and to determine whether the light sources are emitting light in each of the frames. For instance, the sample logic 254 may identify the light source 130 in a first frame. The sample logic 254 may then identify the light source 130 in three subsequent frames. The sample logic 254 may determine that the light source 130 is on in the first frame, off in the second frame, on in the third frame, and off in the fourth frame and assign chip values accordingly. Upon determining chips 260, the light detector 250 may output the chips 260 to the FSK demodulator 270 for interpretation.

In many embodiments, the light detector 250 may be designed to capture a minimum of one packet of data in contiguous video frames. In other embodiments, the FSK demodulator 270 may be designed to discard packets of chips that are not captured in contiguous frames. In some embodiments, the packet may comprise bits representing the SFD, bits representing the data of the packet, and bits representing a cyclic redundancy check (CRC). The CRC may allow a receiving device to verify that the data received by the receiving device matches, to some degree of accuracy, the data. For example, the SFD may comprise two bits of data that are just fillers or are bits representing the SFD. The data may comprise the identification number for the light source and the CRC may comprise a four-bit CRC such as a sum of the bits in the data.

In alternative embodiments, the packet may comprise only the SFD and the data and, in some embodiments, the data only comprises the identification number associated with the light source. In other embodiments, the packet comprises the data and the CRC.

The FSK demodulator 270 receives the chips 260 from the light detector 250 and determines bits of the data transmitted to the light detector 250 from the light source. More specifically, the FSK demodulator 270 may determine the bits of data transmitted to the light detector 250 in packets by determining the location of the start frame delimiter within the packet and then decoding the chips associated with bits of the packet based upon the location of the start frame delimiter within the packet.

The FSK demodulator 270 may comprise frequency logic 271 and data associator 280. The frequency logic 271 may determine frequency components of the signal represented by the chips 260 and the data associator 280 may associate the frequency components with the start frame delimiter frequency, identifying the location of the start frame delimiter. The frequency logic 271 may then associate the frequency components with bits of the data to output data 290 to a position processor 295.

In the present embodiment, the frequency logic 271 comprises FFT logic 272, a frequency bin 274, a frequency bin 276, and frequency bins 278. The FFT logic 272 may comprise, e.g., a four point FFT logic and may transform the time domain waveform samples 260 into frequency domain representations of the chips 260 to generate the frequency components and output the magnitudes of the frequency components into the respective frequency bins 274, 276 and 278. In other embodiments, the FFT logic 272 may determine commensurate patterns in the time domain via time domain processing without transforming the samples into the frequency domain. For embodiments in which two or more frames of "half bright" light precedes the SFD, the four points to process for locating the SFD may be more easily identified.

Data associator 280 may determine the bit associations with the samples based upon the magnitudes of the frequency components in the respective frequency bins 274, 276 and 278. For example, the frequency bin 274 may be associated with the logical 0, the frequency bin 276 may be associated with a logical 1, and the frequency bins 278 may be associated with the start frame delimiter (SFD) frequency.

The data associator 280 may comprise SFD logic 282 to determine that the frequency components determined by frequency logic 271 are associated with the start frame delimiter and begin to make bit decisions for data immediately following the receipt of the SFD. For instance, data associator 280 may receive two cycles of frequency components having the greatest magnitude in the frequency bins 278 and determine that the subsequent data will comprise data such as the identification number (or bit sequence) associated with the light source.

The data associator 280 may comprise a data identifier 284 to determine data 290 via bit decisions based upon the magnitudes of the frequency components in the bins 274, 276, and 278. The data identifier 284 may comprise logic to associate frequency components having the most significant magnitudes in the frequency bin 274 with a logical 0 and the frequency components having the most significant magnitudes in the frequency bin 276 with a logical 1. The data identifier 284 may output data representative of these bit decisions.

In many embodiments, the data associator 280 may comprise repeat decoding logic 286 to make final bit decisions based upon bits determined in more than one packets of data from the same light source. For instance, the light detector 250 may receive and sample light from frames of five packets. If the frames are contiguous, the apparatus 200 may determine chips for the frames, separate the frames into vectors representative of packets, locate the start frame delimiters of the frames, reorder the chips into linear vectors of packets that begin with the start frame delimiter or with the chips for the first bit in the packet, and then make bit decisions for each of the packets based upon the chips. After making bit decisions for each of the packets, the repeat decoding logic 286 may compare the bit decisions of each bit position to make the final bit decisions.

In some embodiments, if even numbers of packets are decoded, the repeat decoder logic 286 may eliminate one of the packets by comparing the variances associated with bits of the packets. In several embodiments, the variances may be calculated as the square of the difference between chip and a threshold value for the chip divided by the number of chips in the packet. In some embodiments, the threshold may comprise the average value of the samples from the frames.

The position processor 295 may receive the identification number of the light source as well as identification numbers for one or more other light sources. Based upon the identification numbers for the light sources, the position processor 295 may determine the location of the receiving device. In some embodiments, the position processor 295 may access a database to determine the locations of the light sources. In further embodiments, the position processor 295 may access a database to retrieve other information related to the position of the receiving device based upon the identification numbers.

In some embodiments, the position processor 295 may be integrated with or coupled with the receiving device. In other embodiments, the database may be remote from the receiving device and access wirelessly to obtain data related to the location of the light sources and/or data related to the location of the receiving device.

Figure 3:
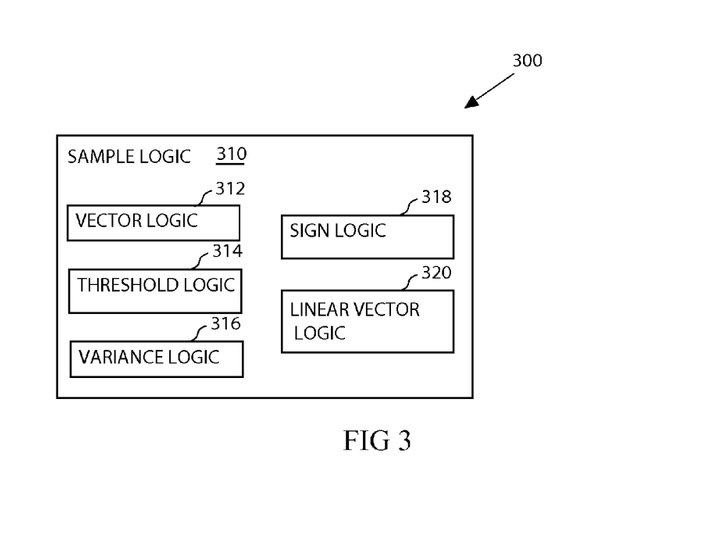
FIG. 3 depicts an embodiment of sampling logic.

Referring also to FIG. 3, there is shown an embodiment of the sample logic 310 such as the sample logic 254 of FIG. 2. The sample logic 310 may receive video frames from a camera such as camera 252 and determine chips and variances associated with light sources captured in the frames. The sample logic 310 may maintain the values from the frames in a memory and, in some embodiments, the chips determined from the values in the memory. In some embodiments, the memory may comprise non-volatile memory such as flash memory or a random access memory. In other embodiments, the memory may comprise volatile memory such as dynamic random access memory.

The sample logic 310 comprises vector logic 312, threshold logic 314, variance logic 316, sign logic 318, and linear vector logic 320. The vector logic 312 may receive the values from the same light source from the frames and separate these values into packets. For example, if two frames are sampled per bit and there are 12 bits in a packet, then the vector logic 312 may separate the values into 24 values per packet.

The threshold logic 314 may determine a threshold value between the minimum and maximum values determined for a light source to distinguish whether a value in a frame for the light source indicates that the light source is on or the light source is off. In some embodiments, the threshold may comprise the average value of the values in a packet. In other embodiments, the threshold may comprise the average value of the values in multiple packets. In further embodiments, the threshold value may comprise an average value over multiple packets if the frames for the multiple packets are contiguous.

The variance logic 316 may determine a variance associated with the values of the frames for the light source. In many embodiments, the variance may provide information regarding the likelihood that the values captured from the frames are erroneous. For example, for embodiments in which the sampling frequency of the camera 252 differs slightly from the frequency of the light source, the phase of the sampling frequency phase may slowly drift into phase and out of phase with respect to the frequency of the modulation of the light source. In such situations, the energy captured for the light source may be captured near or at the threshold value. In such instances, the errors in determining the chip associated with the value captured from the light source may increase, causing a burst of errors in certain packets received from the light source by the light detector 250. The packets associated with the burst of errors can be identified and eliminated from packet bit determinations by evaluation of the variance of the values of such packets against the variance associated with other packets for the same light source.

In several embodiments, the variance for a chip may be determined by calculating the different between the value and the threshold. In some embodiments, the variance may be calculated as:

Variance=((value−threshold)^2)/number of chips wherein the number of chips may equal the number of chips in a packet or may equal the number of values that are utilized to determine the threshold value for determining the chips from the values.

The sign logic 318 may determine a chip value based upon a comparison of the value from the frame with the threshold. For example, the sign logic 318 may assign a +1 chip value to a chip representing a value that is greater than the threshold and assign a (−1) chip value to a chip representative of value from a frame that is less than the threshold. In other embodiments, different sets of chip values may be assigned such as a (+1) and (0), a (+2) and (−2), or other values. In several embodiments, the sign logic 318 may calculate the chip as:

Chip=sign[value−threshold]

wherein sign [ . . . ] is a function to assign a value of (+1) or (−1) to Chip depending upon whether the value is greater than or less than the threshold, respectively.

The linear vector logic 320 may receive feedback from the FSK demodulator 270 indicating the location of the start frame delimiter and reorder the vector of the packet such that the start frame delimiter is the first set of bits in the packet followed by the chips representing the bits of the packet in order from the first bit position to the last bit position. For example, if there are 24 bits in a packet, two bits represent the start frame delimiter, and there are two chips per bit, the linear vector logic 320 may receive the chip or bit position of the start frame delimiter and reorder the chips such that the first four chips in the linear vector are the chips that represent the start frame delimiter. The next two chips comprise the first bit in the packet; the next couple chips represent the second bit in the packet; and so on such that the last two chips represent the last bit in the packet.

Figure 4:
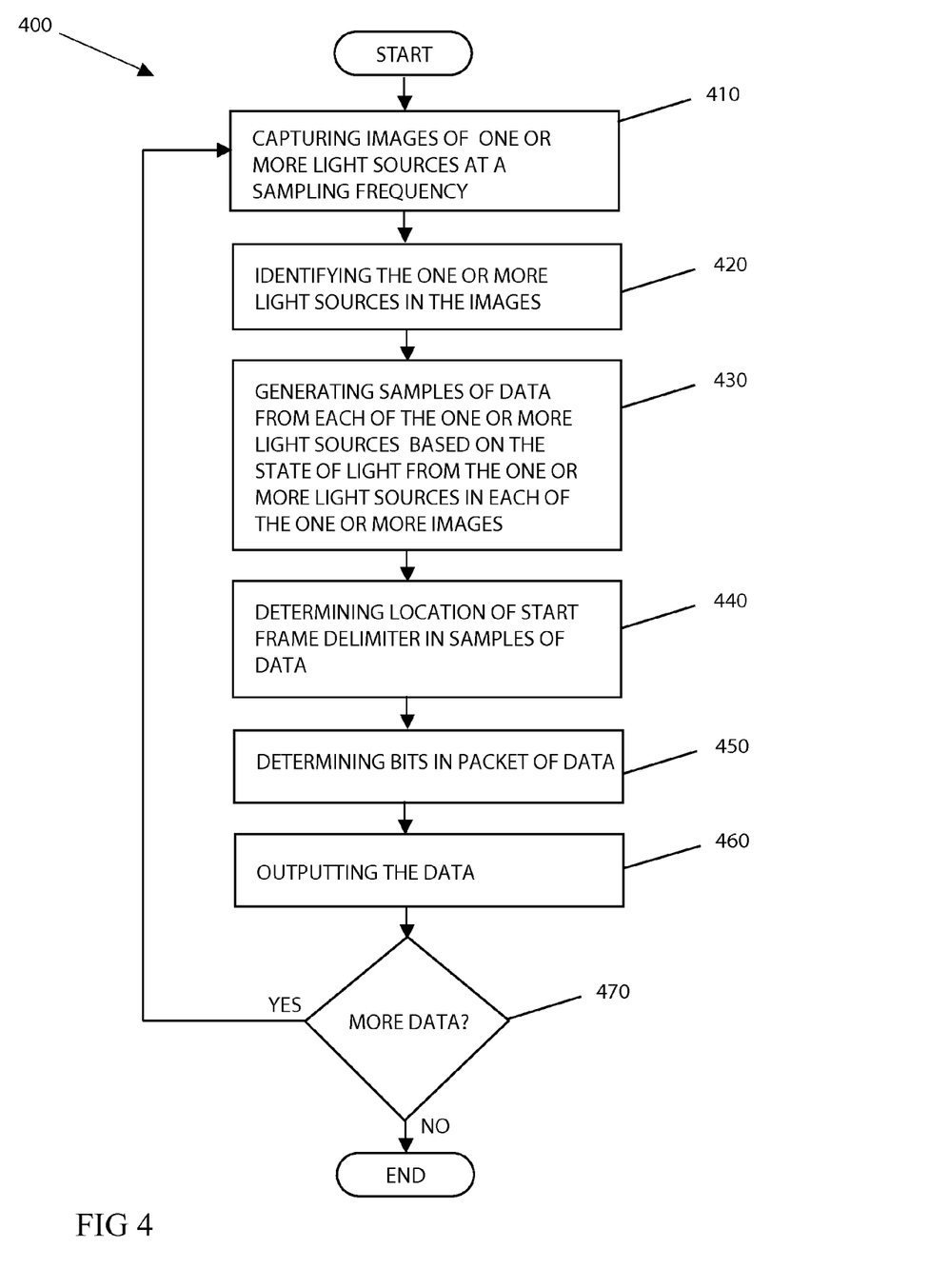
FIG. 4 illustrates a flow chart of an embodiment for error correction in decoding data from an electromagnetic radiator.

FIG. 4 illustrates a flow chart 400 of an embodiment to receive data by varying a modulation frequency of an amplitude-modulated light source. Flow chart 400 begins with capturing images of one or more light sources at a sampling frequency (element 410). For instance, a user may have an iPhone (the receiving device) and may walk into an office building on the way to meet with a person maintaining an office in the building. The iPhone may capture images of the light sources as the user walks into the building. At least some of the light sources may be electromagnetic radiators that are frequency modulated at frequencies that the identify data to the iPhone such as 1×, 1.25× and 1.5× of the sampling frequency of the camera on the iPhone.

The iPhone may identify the one or more light sources that are electromagnetic radiators in the captured images (element 420) and may generate samples based upon light received (element 430). For example, a camera of the iPhone (the light detector) may receive light and, in response, generate an output signal including chips indicative of the energy received from the light source in each of the frames received from each of the light sources. In some embodiments, the light may be visible light while, in other embodiments, the light may be infrared light or ultraviolet light. In many embodiments, sample logic will also generate variances associated with the chips.

The FSK demodulator may receive the output signal from the light detector and determine, based upon the characteristics of the output signal, the data that the light represents. In many embodiments, the FSK demodulator may comprise logic to determine the apparent frequency of the modulation of the light received from each of the light sources and, based upon the frequency, determine data for one or more bits of data to associate with the light. The FSK demodulator may begin by determining the location of the start frame delimiter (element 440). Two or more frames of half bright light samples preceding the start frame delimiter may facilitate identification of the start frame delimiters in several embodiments. In some embodiments, the FSK demodulator may reorder the chips into a linear vector based upon the location of the start frame delimiter. In other embodiments, the FSK demodulator may pass the location of the start frame delimiter back to the sample logic to linearize the vector of chips forming a packet. In further embodiments, the location of the start frame delimiter is stored or maintained so that the chips associated with the start frame delimiter are associated with the first chips in the packet.

After determining the location of the start frame delimiter, the FSK demodulator may determine the bits of data in the packet (element 450). For instance, the light may be amplitude modulated at three different frequencies: the first frequency of N*Fs, a second frequency of (N+½)*Fs, and a delimiter frequency between the first frequency and the second frequency. The FSK modulator may determine the component frequencies of the amplitude modulation of the light and associate the component frequencies with a pattern of logical ones and zeros based upon the amplitude or magnitude of the component frequencies. The FSK demodulator may comprise a data associator to associate frequencies with logical ones or zeros and SFD logic to identify the start frame delimiter. In many embodiments, the data associator may utilize a table that associates frequencies of modulation of light with bits of data. In other embodiments, the data associator may comprise logic to associate the frequencies with bits of data. And, in some embodiments, the logic may comprise a state machine to associate the frequencies with bits of data.

In some embodiments, the FSK demodulator may compare bit determinations in different packets from the same light source to reduce the packet error rate. For instance, the FSK demodulator may comprise repeat decoding logic to make final bit decisions for a packet based upon the bits determined from multiple linear vectors since the light source repeatedly transmits the same packet. The final bit decisions for the packet may select the prevalent bit value (i.e., logical one or logical zero).

The FSK demodulator may output the data associated with the light (element 460) and then determine whether additional data is transmitted via the light (element 470). In some embodiments, the FSK demodulator continues to determine the identification numbers from the data transmitted by the light to update the location of the receiving device as the user moves through the building.

The FSK demodulator may be implemented within a processor-based device such as a smart phone or a laptop. A camera built-into or otherwise coupled with the processor-based device may operate as the light detector and the FSK demodulator may comprise logic in the form of code and/or hardware within the processor-based device. When executed, logic in the form of code may cause the processor-based device to perform operations of the FSK demodulator. In other embodiments, the FSK demodulator may be a distinct device and may couple with the processor-based device.

Figure 5:
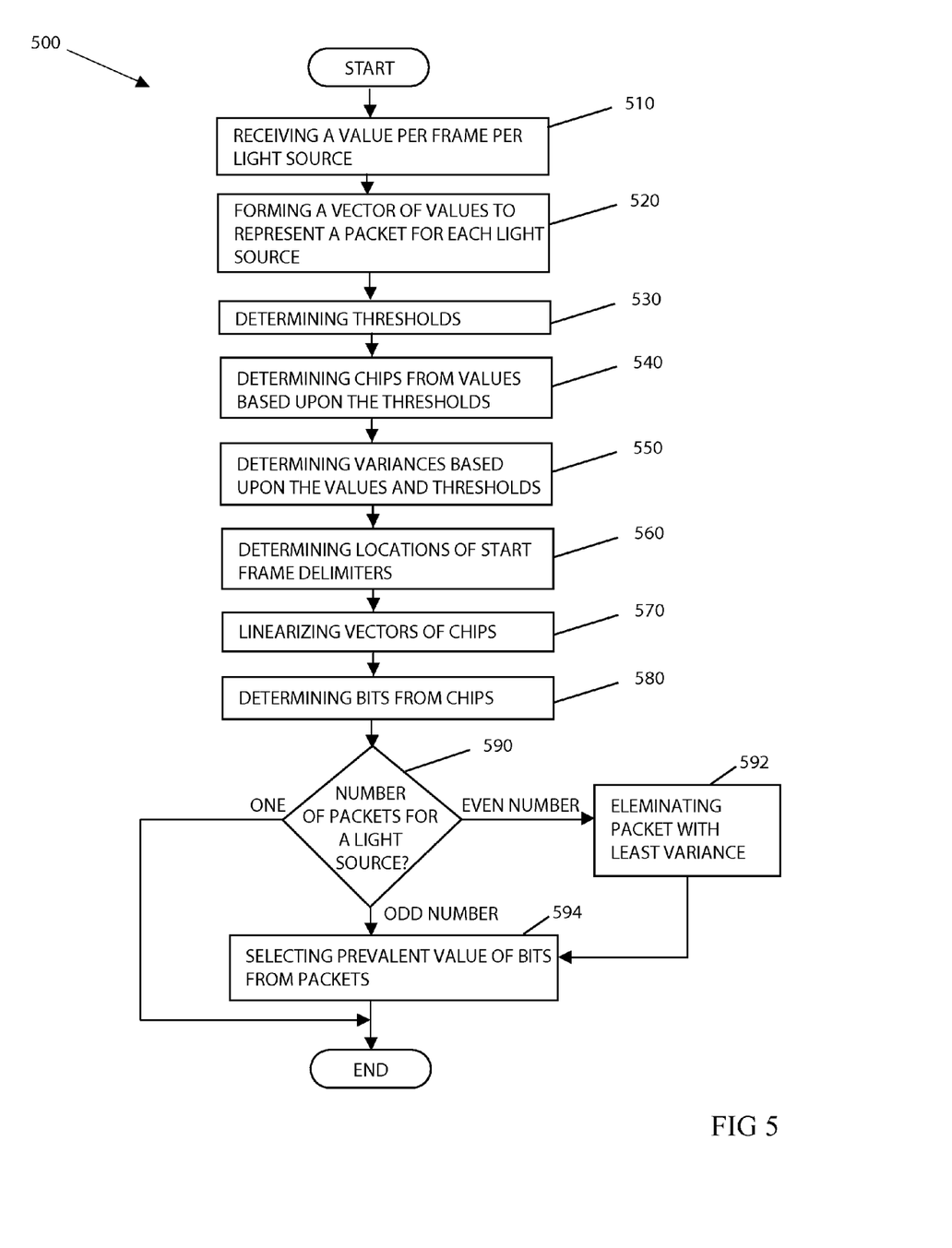
FIG. 5 illustrates a flow chart of an embodiment to decode data received from an amplitude-modulated light source.

FIG. 5 illustrates a flow chart 500 of an embodiment to translate the values from frames associated with light sources into a packet of data per light source. Flow chart 500 begins with receiving a value per frame per light source (element 510). For instance, a user device may receive contiguous frames of video, captured at a sampling frequency, indicative of a packet of data being transmitted via the light source. The frames may be evaluated, assigning pixels with light sources and determining a value to assign to each of the light sources in the frame based upon the amount of energy or intensity of light captured from the light source.

The sampling logic may process the values to determine chips by forming the values into a vector representative of the packet for each light source (element 520) and determining a threshold between the minimum and maximum of the values for each light source (element 530). In some embodiments, the threshold may comprise an average value of the minimum and maximum values determined for the light source. In several embodiments, if the vectors represent contiguous frames of video of the light source, the threshold may comprise the average of the minimum and maximum values for multiple vectors.

After determining the threshold for each light source, the sampling logic may process the values to determine chips from the values based upon the threshold (element 540). In many embodiments, the sampling logic may subtract the threshold from the value and assign values based upon the sign of the resulting difference. For instance, the sampling logic may assign a (−1) to values that are less than the threshold and a (+1) to values that are greater than the threshold.

In many embodiments, the sampling logic may determine a variance associated with a chip based upon the threshold for each light source (element 550). The sampling logic may communicate the variance with the chip value to a repeat decoding logic so that the repeat decoding logic can discard a packet for a light source with the least variance.

The flow chart 500 continues with determining locations of the start frame delimiters for each vector (element 560). The FSK demodulator may perform a Fourier transform on each set of successive chip groups in each vector to find the locations of the stall frame delimiter. Determining the location of the start frame delimiter may involve identifying a pattern indicative of the start frame delimiter and selecting the start frame delimiter from two or more identified locations of the start frame delimiter. The inclusion of two or more frames of half-bright light, by the source device, preceding the start frame delimiter may facilitate identification of the start frame delimiters.

After locating the start frame delimiter, linear vector logic, which may be part of the FSK demodulator or the sampling logic, may linearize the vectors of chips associated with each of the light sources based upon the location of the start frame delimiter (element 570). Linearizing the vectors may involve reordering the vectors such that the start frame delimiter chips are the first set of chips in the vector. In other embodiments, linearizing the vectors may involve removing the start frame delimiters and reordering the chips in the vectors such that the first set of chips in the vector represent the first bit position and the last set of chips in the vector represent the last bit position.

The FSK demodulator may then determine the bits of the packets associated with the light sources from the chips in the linearized vectors for each of the respective light sources (element 580). Determining the bits based upon the chips may involve calculating magnitudes of Fourier Transform bins for two or more chips representative of a single bit and determining whether the magnitudes of Fourier Transform bins represent a logical one or a logical zero.

After making the initial bit decisions for packets, repeat decoding logic may make final bit decisions for each light source that the FSK demodulator has determined more than one packet of bits (element 590). In the present embodiment, if the FSK demodulator determines one packet, the processing ends. If the FSK demodulator determines an odd number of packets other than one, the repeat decoding logic may select the prevalent value of the bits from the packets (element 594). And if the FSK demodulator determines an even number of packets, the repeat decoding logic may eliminate the packet with the least variance from the threshold (element 592) and may then select the prevalent value of the bits from the packets (element 594).

The following examples pertain to further embodiments. One example comprises a method for error correction in decoding data. The method may involve receiving values determined from frames, the values indicative of light emanated from a light source, wherein the frames comprise a packet of data. The method may involve processing the values to determine chips, wherein processing the values comprises selecting chips indicative of the values, wherein the chips are indicative of on and off states of the light source in the respective frames. The method may also involve processing the chips to determine a location of a start frame delimiter within the chips. The method may also involve processing the chips, based upon the location of the start frame delimiter within the chips, to determine bits of the packet of data.

In some embodiments, the method may further comprise capturing the frames as video at a sampling frequency. In some embodiments of the method, receiving values comprises receiving values determined from frames of more than one transmissions of the packet of data and wherein processing the chips to determine bits comprises processing the chips of the more than one transmissions of the packet of data with repeat decoding. In further embodiments of the method, processing the values to determine chips comprises forming the values into a vector representative of the packet and determining a threshold between the minimum and maximum of the values. In some embodiments of the method, processing the values to determine chips comprises determining the chips from the values based upon the threshold. In further embodiments of the method, processing the values comprises determining a variance and discarding a packet with the least variance. In further embodiments of the method, processing the chips to determine the location of the start frame delimiter comprises identifying a pattern indicative of the start frame delimiter. In further embodiments of the method, processing the chips to determine the location of the start frame delimiter comprises calculating magnitudes of Fourier Transform bins for two or more chips via Fourier transform processing, or determining commensurate patterns in the time domain via time domain processing. In some embodiments of the method, processing the chips to determine the bits comprises calculating magnitudes of Fourier Transform bins for two or more chips representative of a single bit via Fourier transform processing, or determining commensurate patterns in the time domain via time domain processing. And, in some embodiments of the method, processing the chips to determine the bits comprises assigning a first bit position to a first bit derived from chips immediately following the start frame delimiter in a vector of the chips that represent the packet.

At least one computer program product for error correction in decoding data, the computer program product comprising a computer useable medium having a computer useable program code embodied therewith, the computer useable program code comprising computer useable program code configured to perform operations, the operations to carry out a method according to any one or more or all of embodiments of the method described above.

At least one system comprising hardware and code may carry out a method according to any one or more or all of embodiments of the method described above.

Another example comprises an apparatus for error correction in decoding data. The apparatus may comprise sample logic to receive values determined from frames, the values indicative of light emanated from a light source, wherein the frames comprise a packet of data; and to process the values to determine chips by selecting chips indicative of the values, wherein the chips are indicative of on and off states of the light source in the respective frames. The apparatus may also comprise a data associator coupled with frequency logic to process the chips to detect a location of a start frame delimiter within the chips; and to process the chips, based upon the location of the start frame delimiter within the chips, to determine bits of the packet of data.

In some embodiments, the sample logic comprises vector logic to determine a vector of values indicative of the packet. In some embodiments, the sample logic comprises threshold logic to determine a threshold between a minimum and maximum of the values. In further embodiments, the sample logic comprises sign logic to determine a chip associated with a value based upon a difference between the value and the threshold. In further embodiments, the sample logic comprises variance logic to determine a variance associated with the chip based upon the difference between the value and the threshold. In further embodiments, the sample logic comprises linear logic to determine a linear vector of values indicative of the packet based upon the location of the start frame delimiter. In some embodiments, the frequency logic comprises Fourier transform logic to determine magnitudes of more than one frequency bins. In some embodiments, the data associator comprises start frame delimiter logic to detect apparent locations of the start frame delimiter based upon magnitudes of more than one of the chips at more than one frequencies and to determine the location of the start frame delimiter. In further embodiments, the data associator comprises repeat decoding logic to determine an odd number of determinations of bits of the packet and to determine values of bits of the packet based upon the odd number of determinations of bits of the packet. In further embodiments, the data associator comprises repeat decoding logic to determine an odd number of determinations of bits of the packet by eliminating a determination of bits of the packet based upon a variance associated with the packet.

Another example comprises a system for error correction in decoding data. The system may comprise a light detector to detect light in frames from light source at a sampling frequency to produce values associated with the light for the respective frames. The system may also comprise sample logic to receive the values determined from the frames, the values indicative of light emanated from a light source, wherein the frames comprise a packet of data; and to process the values to determine chips by selecting chips indicative of the values, wherein the chips are indicative of on and off states of the light source in the respective frames. The system may also comprise a data associator coupled with frequency logic to process the chips to detect a location of a start frame delimiter within the chips; and to process the chips, based upon the location of the start frame delimiter within the chips, to determine bits of the packet of data.

In some embodiments, the light detector comprises a camera to capture frames of pixels. In some embodiments, the sample logic comprises variance logic to determine a variance associated with the chip based upon the difference between the value and the threshold. In further embodiments, the frequency logic comprises logic to perform a Fourier transform, or time domain processing to identify commensurate patterns in the time domain, with the samples to determine at least the magnitudes of the waveform at the apparent frequencies. In further embodiments, the data associator comprises start frame delimiter logic to detect apparent locations of the start frame delimiter based upon magnitudes of more than one of the chips at more than one frequencies and to determine the location of the start frame. In further embodiments, the data associator comprises repeat decoding logic to determine an odd number of determinations of bits of the packet and to determine values of bits of the packet based upon the odd number of determinations of bits of the packet. In some embodiments, the data associator comprises repeat decoding logic to determine an odd number of determinations of bits of the packet by eliminating a determination of bits of the packet based upon a variance associated with the packet.

Another example comprises a program product for error correction in decoding data. The program product may comprise a storage medium comprising instructions to be executed by a processor-based device, wherein the instructions, when executed by the processor-based device, perform operations. The operations comprise receiving values determined from frames, the values indicative of light emanated from a light source, wherein the frames comprise a packet of data. The operations of transmitting may involve processing the values to determine chips, wherein processing the values comprises selecting chips indicative of the values, wherein the chips are indicative of on and off states of the light source in the respective frames. The operations may also involve processing the chips to detect a location of a start frame delimiter within the chips; and processing the chips, based upon the location of the start frame delimiter within the chips, to determine bits of the packet of data.

In some embodiments, the operations may further comprise capturing the frames as video at a sampling frequency. In some embodiments, receiving values comprises receiving values determined from frames of more than one transmissions of the packet of data and wherein processing the chips to determine bits comprises processing the chips of the more than one transmissions of the packet of data with repeat decoding. In further embodiments of the method, processing the values to determine chips comprises forming the values into a vector representative of the packet and determining a threshold between the minimum and maximum of the values. In some embodiments of the method, processing the values to determine chips comprises determining the chips from the values based upon the threshold. In further embodiments of the method, processing the values comprises determining a variance and discarding a packet with the least variance. In further embodiments of the method, processing the chips to determine the location of the start frame delimiter comprises identifying a pattern indicative of the start frame delimiter. In further embodiments of the method, processing the chips to determine the location of the start frame delimiter comprises calculating magnitudes of Fourier Transform bins for two or more chips via Fourier transform processing, or determining commensurate patterns in the time domain via time domain processing. In some embodiments of the method, processing the chips to determine the bits comprises calculating magnitudes of Fourier Transform bins for two or more chips representative of a single bit via Fourier transform processing, or determining commensurate patterns in the time domain via time domain processing. And, in some embodiments of the method, processing the chips to determine the bits comprises assigning a first bit position to a first bit derived from chips immediately following the start frame delimiter in a vector of the chips that represent the packet.

Another embodiment is implemented as a program product for implementing systems and methods described with reference to FIGS. 1-5. Embodiments can take the form of an entirely hardware embodiment, an entirely software embodiment, or an embodiment containing both hardware and software elements. One embodiment is implemented in software, which includes but is not limited to firmware, resident software, microcode, etc.

Furthermore, embodiments can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid-state memory, magnetic tape, a removable computer diskette, a random access memory (RAM), a read-only memory (ROM), a rigid magnetic disk, and an optical disk. Current examples of optical disks include compact disk—read only memory (CD-ROM), compact disk—read/write (CD-R/W), and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem, and Ethernet adapter cards are just a few of the currently available types of network adapters.

The logic as described above may be part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be apparent to those skilled in the art having the benefit of this disclosure that the present disclosure contemplates transmitting data by varying a modulation frequency of amplitude-modulation of a light source to generate light and receiving the data by undersampling frequencies of modulation of the light with error correction in decoding the data. It is understood that the form of the embodiments shown and described in the detailed description and the drawings are to be taken merely as examples. It is intended that the following claims be interpreted broadly to embrace all variations of the example embodiments disclosed.

What is claimed is:

1. A method for error correction in decoding data comprising:
   receiving, by an apparatus, values determined from frames, the values indicative of light emanated from a light source, wherein the frames comprise a packet of data;
   processing, by the apparatus, the values to determine chips, wherein processing the values comprises selecting chips indicative of the values, wherein the chips are indicative of on and off states of the light source in the respective frames;
   processing, by the apparatus, the chips to determine a location of a start frame delimiter within the chips; and
   processing, by the apparatus, the chips, based upon the location of the start frame delimiter within the chips, to determine bits of the packet of data.

2. The method of claim 1, further comprising capturing the frames as video at a sampling frequency.

3. The method of claim 1, wherein receiving values comprises receiving values determined from frames of more than one transmissions of the packet of data and wherein processing the chips to determine bits comprises processing the chips of the more than one transmissions of the packet of data with repeat decoding.

4. The method of claim 1, wherein processing the values to determine chips comprises forming the values into a vector representative of the packet and determining a threshold between the minimum and maximum of the values.

5. The method of claim 4, wherein processing the values to determine chips comprises determining the chips from the values based upon the threshold.

6. The method of claim 4, wherein processing the values comprises determining a variance and discarding a packet with the least variance.

7. The method of claim 1, wherein processing the chips to determine the location of the start frame delimiter comprises identifying a pattern indicative of the start frame delimiter.

8. The method of claim 1, wherein processing the chips to determine the location of the start frame delimiter comprises calculating magnitudes of Fourier Transform bins for two or more chips via Fourier transform processing, or determining commensurate patterns in the time domain via time domain processing.

9. The method of claim 1, wherein processing the chips to determine the bits comprises calculating magnitudes of Fourier Transform bins for two or more chips representative of a single bit via Fourier transform processing, or determining commensurate patterns in the time domain via time domain processing.

10. The method of claim 1, wherein processing the chips to determine the bits comprises assigning a first bit position to a first bit derived from chips immediately following the start frame delimiter in a vector of the chips that represent the packet.

11. An apparatus for error correction in decoding data comprising:
   sample logic to receive values determined from frames, the values indicative of light emanated from a light source, wherein the frames comprise a packet of data; and to process the values to determine chips by selecting chips indicative of the values, wherein the chips are indicative of on and off states of the light source in the respective frames; and
   a data associator coupled with frequency logic to process the chips to detect a location of a start frame delimiter within the chips; and to process the chips, based upon the location of the start frame delimiter within the chips, to determine bits of the packet of data.

12. The apparatus of claim 11, wherein the sample logic comprises vector logic to determine a vector of values indicative of the packet.

13. The apparatus of claim 11, wherein the sample logic comprises threshold logic to determine a threshold between a minimum and maximum of the values.

14. The apparatus of claim 13, wherein the sample logic comprises sign logic to determine a chip associated with a value based upon a difference between the value and the threshold.

15. The apparatus of claim 14, wherein the sample logic comprises variance logic to determine a variance associated with the chip based upon the difference between the value and the threshold.

16. The apparatus of claim 11, wherein the sample logic comprises linear logic to determine a linear vector of values indicative of the packet based upon the location of the start frame delimiter.

17. The apparatus of claim 11, wherein the frequency logic comprises Fourier transform logic to determine magnitudes of more than one frequency bins.

18. The apparatus of claim 11, wherein the data associator comprises start frame delimiter logic to detect apparent locations of the start frame delimiter based upon magnitudes of more than one of the chips at more than one frequencies and to determine the location of the start frame delimiter.

19. The apparatus of claim 11, wherein the data associator comprises repeat decoding logic to determine an odd number of determinations of bits of the packet and to determine values of bits of the packet based upon the odd number of determinations of bits of the packet.

20. The apparatus of claim 11, wherein the data associator comprises repeat decoding logic to determine an odd number of determinations of bits of the packet by eliminating a determination of bits of the packet based upon a variance associated with the packet.

21. A system for error correction in decoding data comprising:
   a light detector to detect light in frames from light source at a sampling frequency to produce values associated with the light for the respective frames;
   sample logic to receive the values determined from the frames, the values indicative of light emanated from a light source, wherein the frames comprise a packet of data; and to process the values to determine chips by selecting chips indicative of the values, wherein the chips are indicative of on and off states of the light source in the respective frames; and
   a data associator coupled with frequency logic to process the chips to detect a location of a start frame delimiter within the chips; and to process the chips, based upon the location of the start frame delimiter within the chips, to determine bits of the packet of data.

22. The system of claim 21, wherein the light detector comprises a camera to capture frames of pixels.

23. The system of claim 21, wherein the sample logic comprises variance logic to determine a variance associated with the chip based upon the difference between the value and the threshold.

24. The system of claim 21, wherein the frequency logic comprises logic to perform a Fourier transform, or time domain processing to identify commensurate patterns in the time domain, with the samples to determine at least the magnitudes of the waveform at the apparent frequencies.

25. The system of claim 21, wherein the data associator comprises start frame delimiter logic to detect apparent locations of the start frame delimiter based upon magnitudes of more than one of the chips at more than one frequencies and to determine the location of the start frame.

26. The system of claim 21, wherein the data associator comprises repeat decoding logic to determine an odd number of determinations of bits of the packet and to determine values of bits of the packet based upon the odd number of determinations of bits of the packet.

27. The system of claim 21, wherein the data associator comprises repeat decoding logic to determine an odd number of determinations of bits of the packet by eliminating a determination of bits of the packet based upon a variance associated with the packet.

28. A program product for error correction in decoding data comprising:
   a storage medium comprising instructions to be executed by a processor-based device, wherein the instructions, when executed by the processor-based device, perform operations, the operations comprising:
   receiving values determined from frames, the values indicative of light emanated from a light source, wherein the frames comprise a packet of data;
   processing the values to determine chips, wherein processing the values comprises selecting chips indicative of the values, wherein the chips are indicative of on and off states of the light source in the respective frames;
   processing the chips to detect a location of a start frame delimiter within the chips; and
   processing the chips, based upon the location of the start frame delimiter within the chips, to determine bits of the packet of data.

29. The program product of claim 28, wherein the operations further comprise capturing the frames as video at a sampling frequency.

30. The program product of claim 28, wherein receiving values comprises receiving values determined from frames of more than one transmissions of the packet of data and wherein processing the chips to determine bits comprises processing the chips of the more than one transmissions of the packet of data with repeat decoding.

* * * * *